US008049279B2

(12) United States Patent
Huang et al.

(10) Patent No.: US 8,049,279 B2
(45) Date of Patent: Nov. 1, 2011

(54) SEMICONDUCTOR DEVICE AND METHOD FOR FABRICATING THE SAME

(75) Inventors: Han-Min Huang, Taipei County (TW); Chin-Lung Chen, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 190 days.

(21) Appl. No.: 12/497,864

(22) Filed: Jul. 6, 2009

(65) Prior Publication Data

US 2011/0001196 A1    Jan. 6, 2011

(51) Int. Cl.
*H01L 21/8232* (2006.01)
*H01L 21/00* (2006.01)

(52) U.S. Cl. ............... 257/368; 257/401; 257/E21.409; 257/E29.025; 257/E29.04; 257/E29.116; 438/197

(58) Field of Classification Search ................... 257/368, 257/401; 438/197
See application file for complete search history.

(56) References Cited

U.S. PATENT DOCUMENTS

| 4,213,140 | A | * | 7/1980 | Okabe et al. ................... 257/357 |
| 4,841,486 | A | * | 6/1989 | Minato et al. ................... 365/207 |
| 4,849,801 | A | * | 7/1989 | Honjyo et al. ................... 365/154 |
| 5,239,505 | A | * | 8/1993 | Fazio et al. ................. 365/185.11 |

* cited by examiner

*Primary Examiner* — Evan Pert
(74) *Attorney, Agent, or Firm* — WPAT, PC; Justin King

(57) ABSTRACT

A semiconductor device includes a substrate of a first conductivity type, a first doped region of a second conductivity type, at least one second doped region of the first conductivity type, a third doped region of the second conductivity type, a gate structure, and at least one contact. The first and the second doped regions are configured in the substrate, and each second doped region is surrounded by the first doped region. The third doped region is configured in the substrate outside of the first doped region. The gate structure is disposed on the substrate between the first and third doped regions. The contact is disposed on the substrate. Each contact connects, in a direction parallel to the gate structure, the first and second doped regions alternately.

20 Claims, 12 Drawing Sheets

SEMICONDUCTOR DEVICE AND METHOD FOR FABRICATING THE SAME

BACKGROUND OF THE INVENTION

1. Field of the Invention

The present application relates to an integrated circuit. More particularly, the present application relates to a semiconductor device.

2. Description of Related Art

With rapid advancement of semiconductor fabricating technology, the integration level of integrated circuits is bound to increase continuously in order to improve the device speed and performance and comply with current requirements for light weight, slimness, and compactness. Improvement of the integration level inevitably relies on reducing an area occupied by the semiconductor device.

FIG. 1A is a schematic top view of a conventional semiconductor device. FIG. 1B is a schematic cross-sectional view taken along a line segment I-I' depicted in FIG. 1A. As shown in FIGS. 1A and 1B, bar-shaped gate structures 102a and 102b are located on a substrate 100 in conventional metal-oxide semiconductor (MOS) devices 101a and 101b, respectively. A drain 104a and a source 106a extending along a direction parallel to the gate structure 102a are located in the substrate 100 and disposed at respective sides of the gate structure 102a, and a drain 104b and a source 106b extending along a direction parallel to the gate structure 102b are located in the substrate 100 and disposed at respective sides of the gate structure 102b. A doped region 108 extending along a direction parallel to the gate structures 102a and 102b is disposed in the substrate 100 between the source 106a of the MOS device 101a and the source 106b of the MOS device 101b, and the doped region 108 serves as a substrate terminal shared by the MOS devices 101a and 101b. A plurality of contacts 110 extending along a direction perpendicular to the gate structures 102a and 102b commonly connect the source 106a, the doped region 108, and the source 106b.

Said design of serially connecting the bar-shaped MOS devices 101a and 101b through the contacts 110 requires a large layout area and a significant chip area. Namely, said layout is prone to lower down the integration level of the device, thus resulting in high costs on chips and inability to miniaturize the chips. Accordingly, it is an imperative issue to reduce the layout area and maintain performance of the semiconductor device while the chip area is limited.

SUMMARY OF THE INVENTION

In light of the foregoing, the present application is directed to a semiconductor device and a method for fabricating the same, wherein the semiconductor device has a relatively compact layout design.

In the present application, a semiconductor device including a substrate of a first conductivity type, a first doped region of a second conductivity type, at least one second doped region of the first conductivity type, a third doped region of the second conductivity type, a gate structure, and at least one contact is provided. The first and the second doped regions are configured in the substrate, and each second doped region is surrounded by the first doped region. The third doped region is configured in the substrate outside of the first doped region. The gate structure is disposed on the substrate between the first and third doped regions. The contact is disposed on the substrate. Each contact connects, in a direction parallel to the gate structure, the first and second doped regions alternately.

According to an exemplary embodiment of the present invention, each contact connects at least three joined first and second doped regions alternately.

According to an exemplary embodiment of the present invention, when the semiconductor device includes a plurality of the second doped regions, the second doped regions are arranged in the direction parallel to the gate structure.

According to an exemplary embodiment of the present invention, when the semiconductor device includes a plurality of the contacts, the contacts are arranged in the direction parallel to the gate structure.

According to an exemplary embodiment of the present invention, the first region serves as a common source of the semiconductor device and another semiconductor device adjacent thereto.

According to an exemplary embodiment of the present invention, the semiconductor device is a MOS device.

According to an exemplary embodiment of the present invention, the semiconductor device is a high voltage device or a low voltage device.

According to an exemplary embodiment of the present invention, a bipolar junction transistor (BJT) is further included, wherein the BJT and the semiconductor device share the contact. The BJT and the semiconductor device may share the second and the third doped regions. The semiconductor device is a sidewall MOS device, for example.

According to an exemplary embodiment of the present invention, the first conductivity type is the P type while the second conductivity type is the N type, and the first conductivity type is the N type while the second conductivity type is the P type.

In the present invention, a semiconductor device including a substrate of a first conductivity type, a first doped region of a second conductivity type, at least one second doped region of the first conductivity type, a third doped region of the second conductivity type, a gate structure, and at least one contact. The first and the second doped regions are configured in the substrate. The third doped region is configured in the substrate outside of the first doped region. The gate structure is disposed on the substrate between the first and third doped regions. The contact is disposed on the substrate. Each contact connects, in a direction parallel to the gate structure, at least three joined first and second doped regions alternately.

According to an exemplary embodiment of the present invention, when the semiconductor device includes a plurality of the second doped regions, the second doped regions are arranged in the direction parallel to the gate structure.

According to an exemplary embodiment of the present invention, when the semiconductor device includes a plurality of the contacts, the contacts are arranged in the direction parallel to the gate structure.

According to an exemplary embodiment of the present invention, the first region serves as a common source of the semiconductor device and another semiconductor device adjacent thereto.

According to an exemplary embodiment of the present invention, the semiconductor device is a MOS device.

According to an exemplary embodiment of the present invention, the semiconductor device is a high voltage device or a low voltage device.

According to an exemplary embodiment of the present invention, a bipolar junction transistor (BJT) is further included, wherein the BJT and the semiconductor device share the contact. The BJT and the semiconductor device may share the second and the third doped regions. The semiconductor device is a sidewall MOS device, for example.

According to an exemplary embodiment of the present invention, the first conductivity type is the P type while the second conductivity type is the N type, and the first conductivity type is the N type while the second conductivity type is the P type.

In the present invention, a method for fabricating a semiconductor device is described as follows. A substrate of a first conductivity type is provided, and a gate structure is formed on the substrate. A first doped region of a second conductivity type and a second doped region of the second conductivity type are formed in the substrate at both sides of the gate structure, respectively. At least one third doped region of the first conductivity type is formed in the substrate. At least one contact is then formed on the substrate. Each contact connects, in a direction parallel to the gate structure, at least three joined first and third doped regions alternately.

According to an exemplary embodiment of the present invention, each third doped region is surrounded by the first doped region.

According to an exemplary embodiment of the present invention, the first conductivity type is the P type while the second conductivity type is the N type, and the first conductivity type is the N type while the second conductivity type is the P type.

Based on the above, the first doped region surrounds each second doped region in the source region of the semiconductor device as disclosed in the embodiments of the present invention. Besides, the contact connects, in the direction parallel to the gate structure, at least three joined first and second doped regions having the alternate conductivity types. Thereby, layout area of the source region can be decreased to ensure that the semiconductor device has a reduced dimension.

Moreover, the fabrication of the semiconductor device as disclosed in the embodiments of the present invention can be applied to all MOS structures, and the semiconductor device can be formed by performing simple fabrication processes compatible with the existing semiconductor fabrication process.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
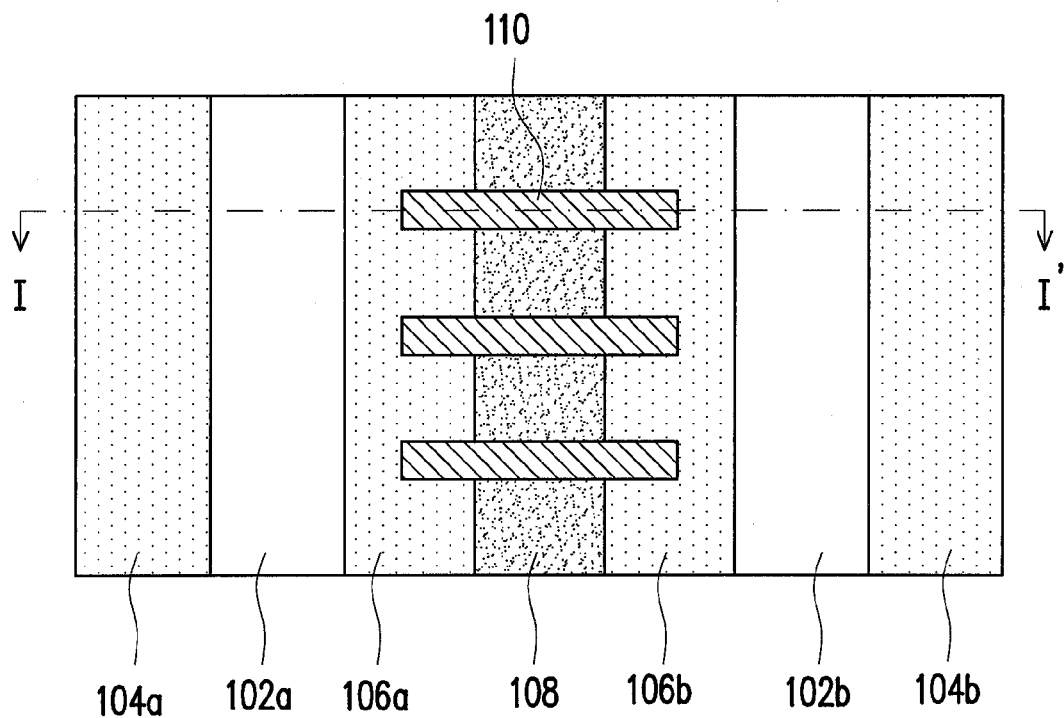
FIG. 1A is a schematic top view of a conventional semiconductor device.
Figure 1B:
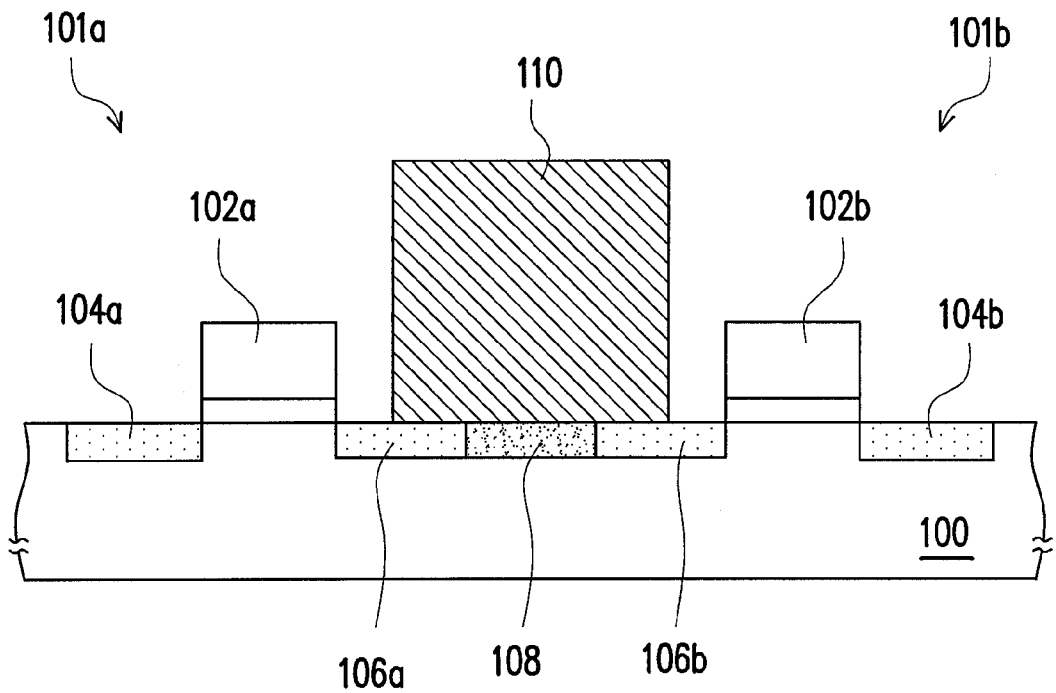
FIG. 1B is a schematic cross-sectional view taken along a line segment I-I' depicted in FIG. 1A.
Figure 2A:
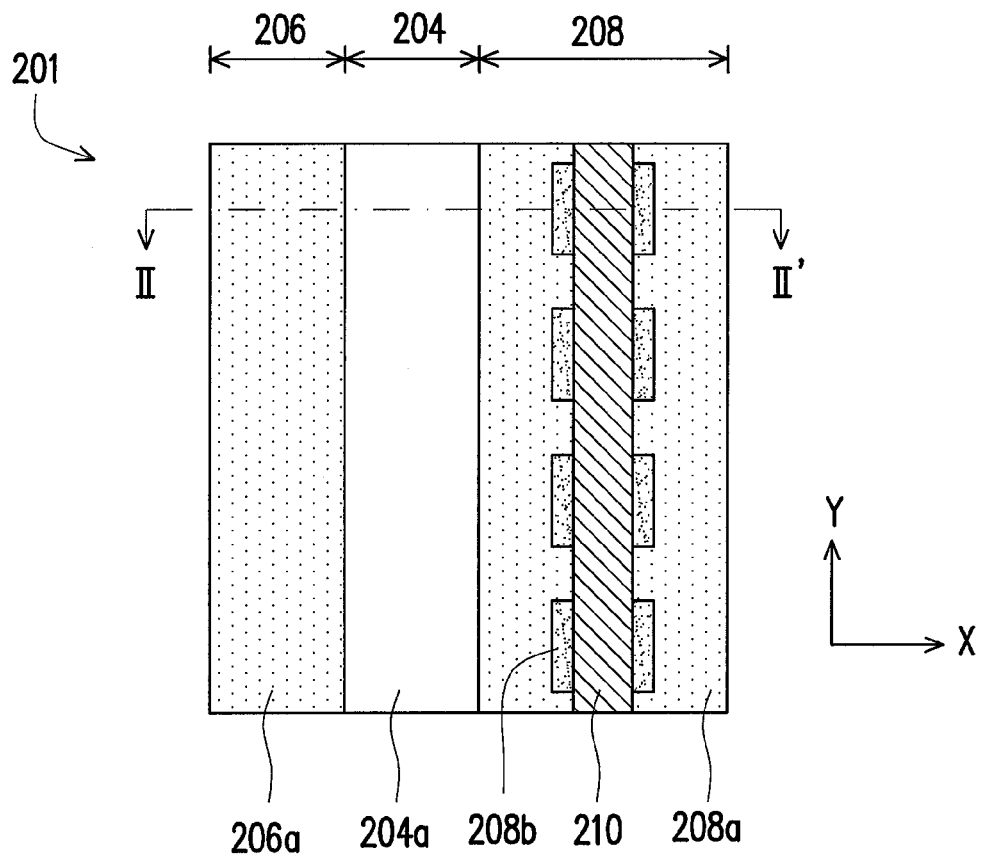
FIG. 2A is a schematic top view of a semiconductor device according to an exemplary embodiment of the present invention.
Figure 2B:
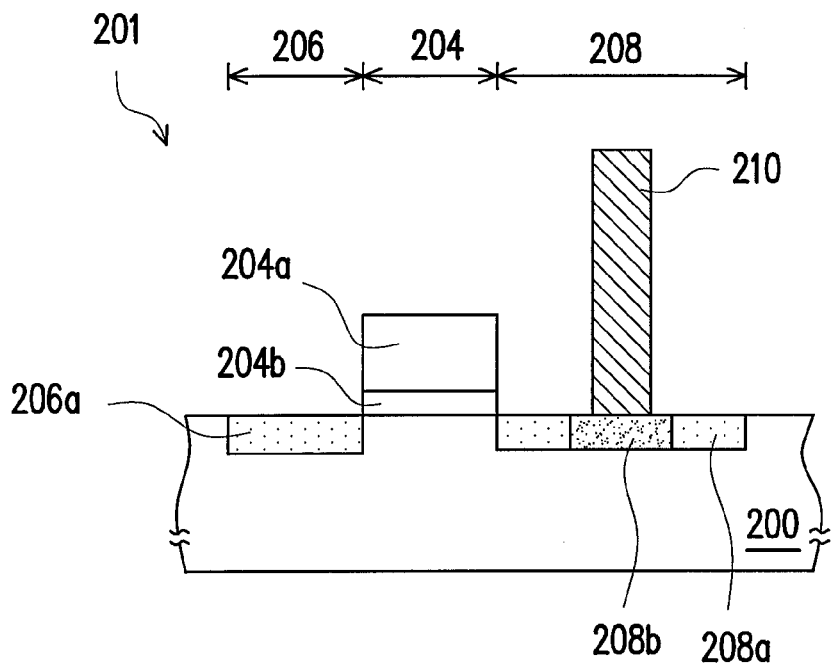
FIG. 2B is a schematic cross-sectional view taken along a line segment II-II' depicted in FIG. 2A.

Explanations of following top views and cross-sectional views are provided for describing the embodiments of the present invention. FIG. 2A is a schematic top view of a semiconductor device according to an exemplary embodiment of the present invention. FIG. 2B is a schematic cross-sectional view taken along a line segment II-II' depicted in FIG. 2A. In the following embodiments, note that a first conductivity type is the P type, and a second conductivity type is an N type, which should however not be construed as limitations to the present invention. People skilled in the art should be able to understand that the first conductivity type can also be an N type, and the second conductivity type can also be the P type according to other embodiments of the present invention.

As indicated in FIGS. 2A and 2B, a semiconductor device 201 of the present invention is, for example, an MOS device formed on a substrate 200 of the first conductivity type. The substrate 200 is, for example, a P-type substrate which can be a silicon substrate or any other semiconductor substrate. In an exemplary embodiment of the present invention, a P-type well (not shown) can also be disposed in the substrate 200. The semiconductor device 201 includes a gate structure 204, a drain region 206, a source region 208, and a contact 210.

The gate structure 204 is located on the substrate 200 between the drain region 206 and the source region 208. The gate structure 204 includes a gate 204a and a gate dielectric layer 204b. The gate dielectric layer 204b is disposed between the substrate 200 and the gate 204a. In an exemplary embodiment of the present invention, the gate structure 204 is a bar-shaped structure extending along a Y direction. The gate 204a is made of doped polysilicon, for example. The gate dielectric layer 204b is made of silicon oxide, for example.

The drain region 206 includes a doped region 206a which is disposed in the substrate 200 and located at a side of the gate structure 204. The doped region 206a of the second conductivity type is, for example, an N+ doped region. In an exemplary embodiment of the present invention, the doped region 206a has a bar-shaped structure extending along the Y direction.

The source region 208 and the drain region 206 are separately disposed, for example. The source region 208 includes a doped region 208a and at least one doped region 208b which are disposed in the substrate 200 and located at the other side of the gate structure 204. In FIG. 2A, four doped regions 208b are exemplarily shown, and each of the doped regions 208b is surrounded by the doped region 208a.

Based on the above, the doped region 208a of the second conductivity type is, for example, the N+ doped region. In an exemplary embodiment of the present invention, the doped region 208a has a bar-shaped structure extending along the Y direction. The doped regions 208b of the first conductivity type are, for example, P+ doped regions. Bottoms of the doped regions 208b are electrically connected to the substrate 200 and serve as terminals of the substrate 200 connected to external devices, for instance. When the source region 208 includes a plurality of the doped regions 208b, the doped regions 208b are distributed separately in the source region 208, for example. According to an exemplary embodiment of the present invention, the doped regions 208b are arranged in a direction parallel to the gate structure 204. That is to say, the doped regions 208b are arranged along the Y direction.

The contact 210 is disposed within the source region 208. The contact 210 connects, in the direction parallel to the gate structure 204, at least three joined doped regions 208a and 208b alternately so as to connect external circuits. To be more specific, the contact 210 is, for example, arranged along the Y direction, and the contact 210 connects at least three joined doped regions in the Y direction. The at least three joined doped regions are composed of the doped regions 208a and 208b, and these doped regions 208a and 208b having the alternate conductivity types are all connected to the same contact 210. Besides, at least one contact (not shown) connecting the doped region 206a is also disposed within the drain region 206 for connecting external circuits. The contact 210 is made of metal or other appropriate conductive materials, for example.

It should be mentioned that the doped regions 208a and 208b are connected through the contact 210 acting as a butting contact, i.e. the doped regions 208a and 208b are connected through sharing the contact 210. Therefore, in the semiconductor device 201, the electric potential at the source terminal is the same as the electric potential at the substrate terminal. In addition, according to an exemplary embodiment of the present invention, the doped regions 208b serving as the substrate terminal are disposed in the source region 208 and distributed in blocks, and the doped region 208a serving as the source terminal is disposed around the doped regions 208b. Since the contact 210 connects the doped regions 208a and 208b along the Y direction, the layout area of the source region 208 can be reduced. As such, compared to the dimensions of a conventional semiconductor device, the dimensions of the semiconductor device 201 in an exemplary embodiment of the present invention is relatively small.

Figure 3:
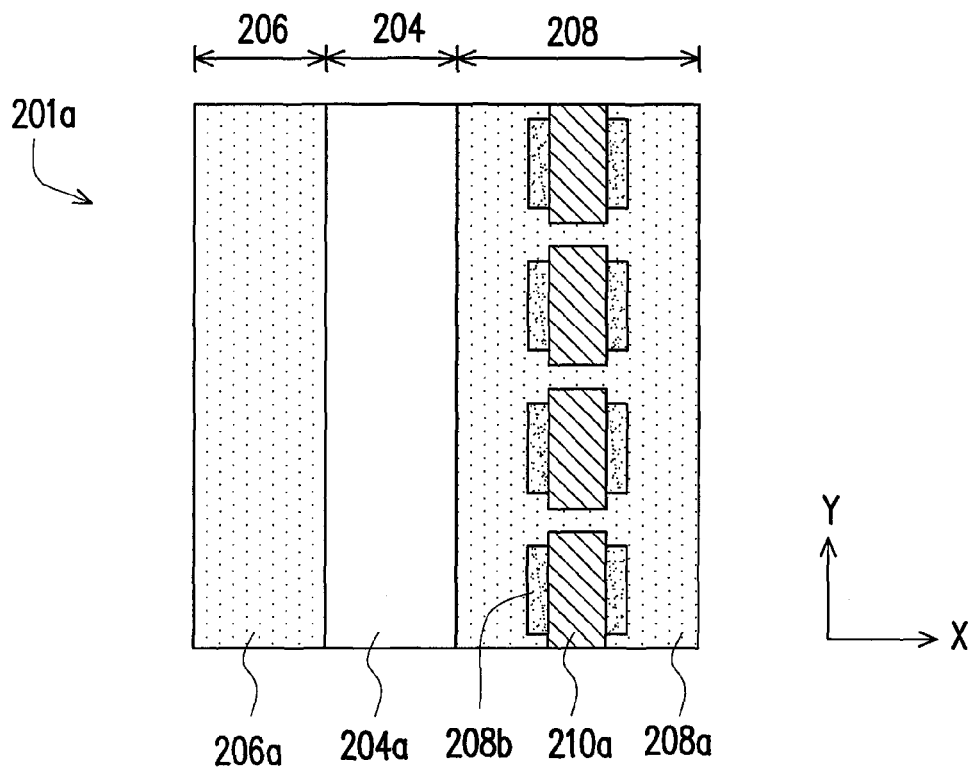
FIG. 3 is a schematic top view of a semiconductor device according to another exemplary embodiment of the present invention.

FIG. 3 is a schematic top view of a semiconductor device according to another exemplary embodiment of the present invention. In FIG. 3, the components identical to those in FIG. 2A are marked by the same reference numbers, and the descriptions of the identical components are omitted herein.

As shown in FIG. 3, the primary components of the semiconductor device 201a are substantially the same as the primary components of the semiconductor device 201 depicted in FIG. 2A, while the main difference between the semiconductor devices 201 and 201a lies in that the semiconductor device 201a includes a plurality of contacts 210a. The contacts 210a parallel to the gate structure 208 are arranged along the Y direction, for example. Each of the contacts 210a extends along the Y direction and connects three joined doped regions 208a and 208b alternately for connecting external circuits. When the semiconductor device 201a has a plurality of contacts 210a, the contacts 210a, for example, form an inconsecutive structure connecting the doped regions 208a and 208b along the Y direction on the source region 208.

In FIG. 3, each of the contacts 210a sequentially connects three joined doped regions 208a, 208b, and 208a, for example. According to an exemplary embodiment, each of the contacts 210a can also connect three joined doped regions 208b, 208a, and 208b in sequence. Certainly, in other embodiments, when there are a plurality of contacts 210a, each of the contacts 210a can connect at least three joined doped regions 208a and 208b alternately, which is not limited in the present invention.

Figure 4:
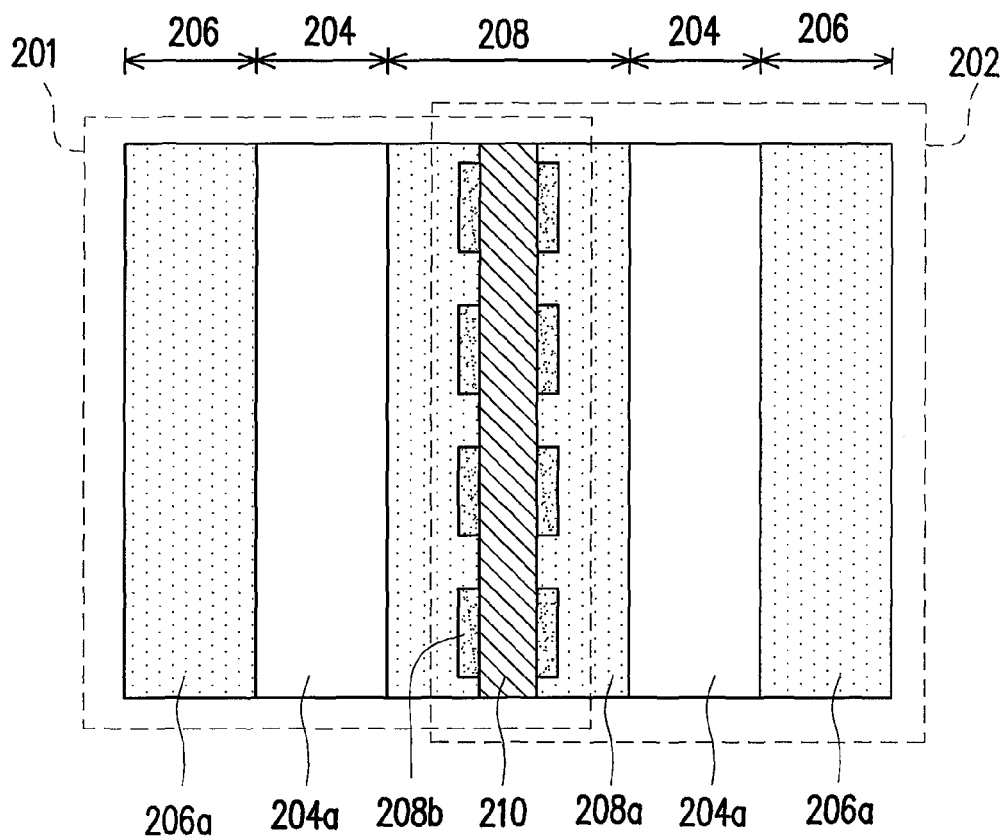
FIGS. 4 and 5 are schematic top views of semiconductor devices according to another exemplary embodiment of the present invention.
Figure 5:
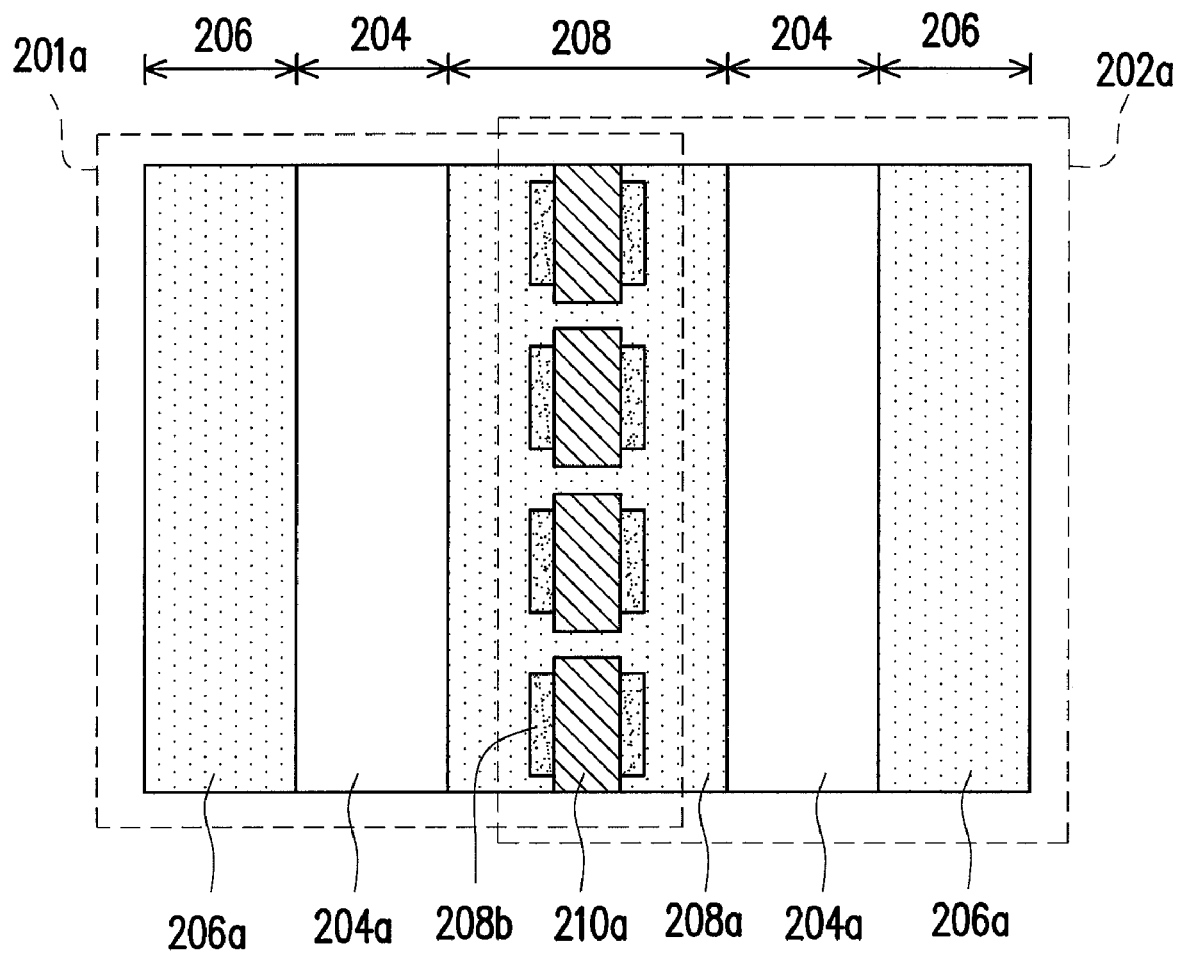

Two semiconductor devices are hereinafter taken as examples for elaborating the present invention. Note that people skilled in the art should be able to embody the present invention based on the following embodiments, whereas the scope of the present invention is not limited thereby. Namely, the number of the semiconductor devices and the arrangement thereof are not specifically restricted in the present invention. FIGS. 4 and 5 are schematic top views of semiconductor devices according to another exemplary embodiment of the present invention. In FIGS. 4 and 5, the components identical to those in FIGS. 2A and 3 are marked by the same reference numbers, and the descriptions of the identical components are omitted herein.

As shown in FIG. 4, in an exemplary embodiment, adjacent semiconductor devices 201 and 202 are both disposed on the substrate 200. The semiconductor device 202 has the same structure as that of the semiconductor device 201, for example. The semiconductor device 202 includes a gate structure 204, a drain region 206, a source region 208, and a contact 210. The arrangement of components in the semiconductor device 202 is the same as the arrangement of components in the semiconductor device 201. It should be specifically mentioned that the source region 208 in FIG. 4 is located between two gate structures 204 respectively in the adjacent semiconductor devices 201 and 202. Therefore, the two adjacent semiconductor devices 201 and 202 share the source region 208. That is to say, the two adjacent semiconductor devices 201 and 202 share the doped region 208a, the doped regions 208b, and the contact 210 connecting the doped regions 208a and 208b.

As shown in FIG. 5, in another exemplary embodiment, adjacent semiconductor devices 201a and 202a are both disposed on the substrate 200. As shown in FIG. 5, the primary components of the semiconductor devices 201a and 201b are substantially the same as the primary components of the semiconductor devices 201 and 202 depicted in FIG. 4, while the main difference therebetween lies in that the semiconductor devices 201a and 202a respectively include a plurality of contacts 210a.

In FIGS. 4 and 5, the arrangement of the doped regions 208a and 208b and the contact 210 or the contacts 210a is conducive to size reduction of the semiconductor devices. Meanwhile, since two semiconductor devices are simultaneously disposed on the substrate 200, and the two adjacent semiconductor devices share the source region 208, the chip area occupied by the semiconductor devices can be further reduced.

Moreover, the aforesaid semiconductor devices are, for example, high voltage devices or low voltage devices. When the semiconductor devices act as high voltage devices, operating voltage thereof can be within a range of about 10-120 V. When the semiconductor devices act as low voltage devices, the devices may operate under common voltage, e.g. about 2.5-5.0 V. The foregoing high voltage devices can be dynamic threshold metal-oxide semiconductor (DTMOS) devices, field drift metal-oxide semiconductor (FDMOS) devices, or double diffused drain metal-oxide semiconductor (DDDMOS) devices. The semiconductor device acting as high voltage devices according to embodiments of the present invention are illustrated with cross-sectional diagrams or top views as follows.

Figure 6A:
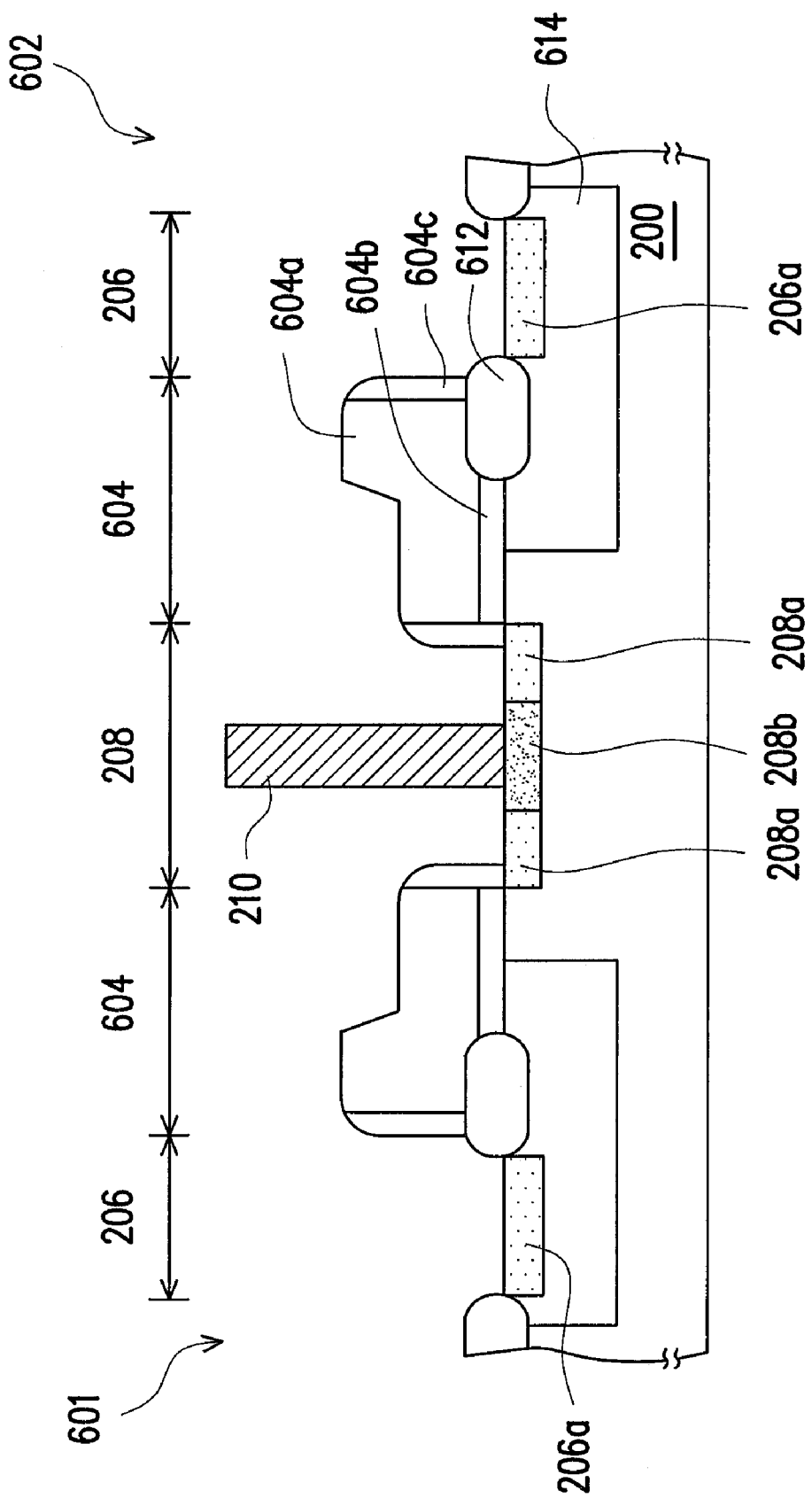
FIGS. 6A, 6B, and 7 are schematic cross-sectional views of semiconductor devices according to another exemplary embodiment of the present invention.
Figure 6B:
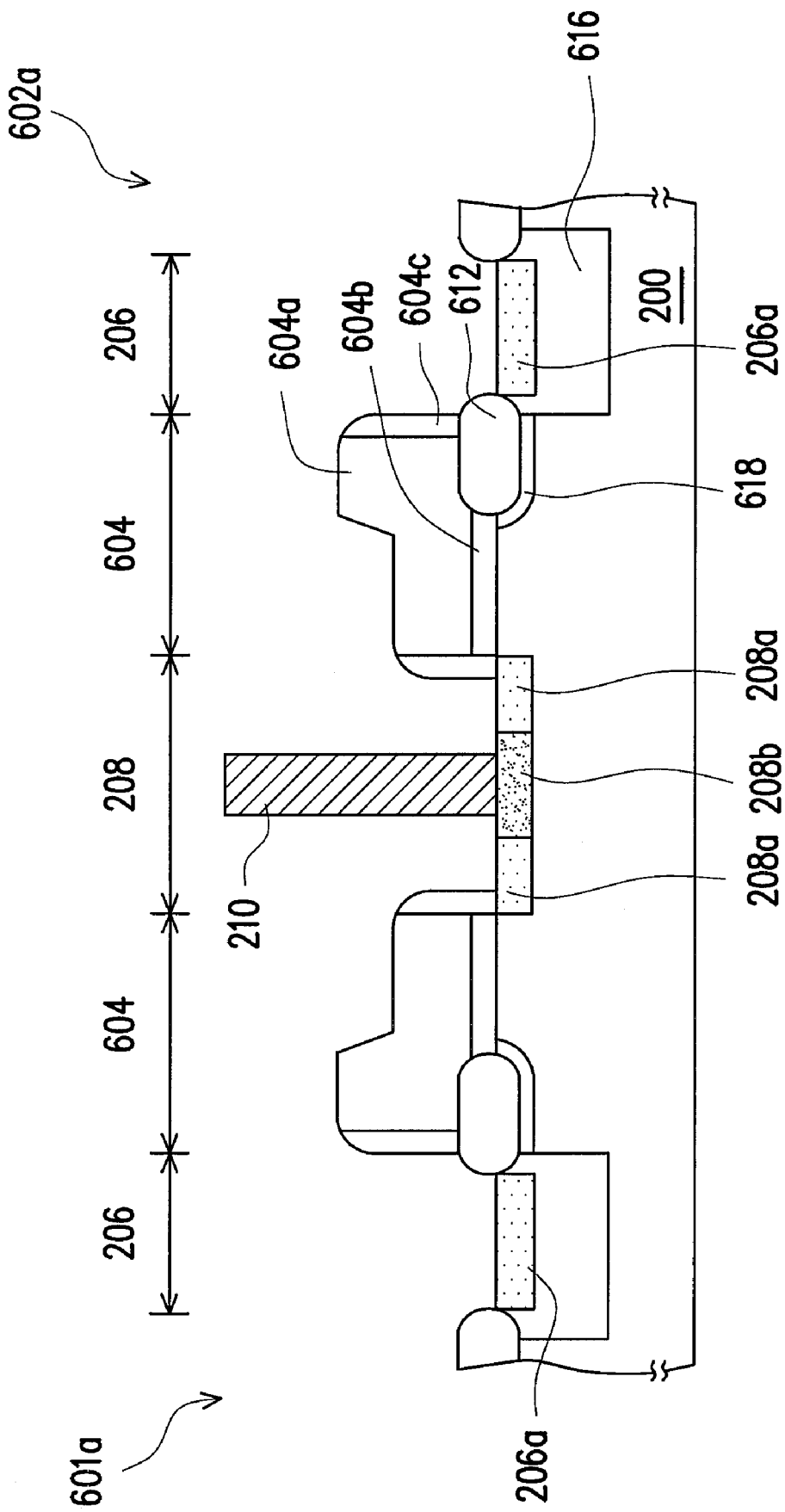
Figure 7:
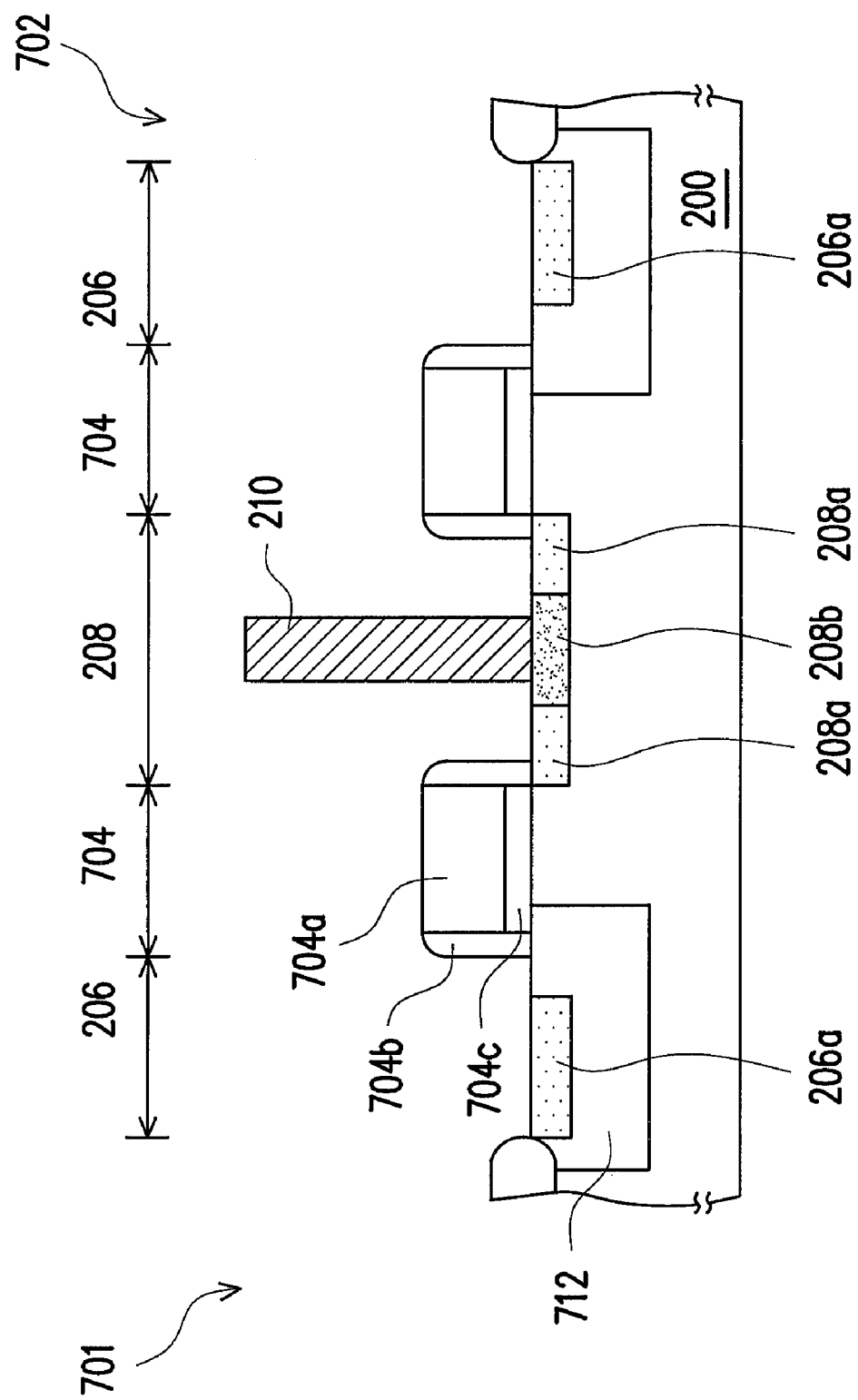

FIGS. 6A, 6B, and 7 are schematic cross-sectional views of semiconductor devices according to another exemplary embodiment of the present invention. In FIGS. 6A, 6B and 7, the components identical to those in FIGS. 2B and 4 are marked by the same reference numbers, and the descriptions of the identical components are omitted herein.

As indicated in FIG. 6A, the semiconductor devices can be high voltage devices 601 and 602 which are field drift metal-oxide semiconductor (FDMOS) devices, for example. The high voltage devices 601 and 602 are, for example, similar to the semiconductor devices 201 and 202 depicted in FIG. 4, while the difference therebetween mainly lies in the gate structures 604 in the high voltage devices 601 and 602. Besides, the high voltage devices 601 and 602 further include isolation structures 612 and wells 614 of the second conductivity type.

The gate structure 604 in each of the high voltage devices 601 and 602 is disposed on the substrate 200 between the drain region 206 and the source region 208. The gate structure 604 includes a gate 604a, a gate dielectric layer 604b, and a spacer 604c. The gate dielectric layer 604b is disposed between the gate 604a and the substrate 200, and the spacer 604c is disposed on a sidewall of the gate 604a and a sidewall of the gate dielectric layer 604b.

The isolation structure 612 in each of the high voltage devices 601 and 602 is disposed between the gate structure 604 and the doped region 206a. According to an exemplary embodiment, the gate 604a neighboring the drain region 206 in each of the high voltage devices 601 and 602 covers a portion of the isolation structure 612. The isolation structure 612 is, for example, a field oxide (FOX) structure or a shallow trench isolation (STI) structure.

The well 614 in each of the high voltage devices 601 and 602 is disposed within the drain region 206 of the substrate 200, and the doped region 206a is, for example, disposed in the well 614. According to an exemplary embodiment, the well 614 can further extend from the drain region 206 to a portion of the substrate 200 located below parts of the gate structure 604. The well 614 is, for example, a high voltage N-type well (HVNW).

Based on the above, a hot carrier effect can be weakened by disposing the isolation structure 612 and the well 614 in each of the high voltage devices 601 and 602, and thereby breakdown voltages at the drain region 206 and the source region 208 can be increased.

In FIG. 6B, the well 614 of the second conductivity type in each of the high voltage devices 601a and 602a can be respectively replaced by a grade 616 of the second conductivity type and a drift 618 of the second conductivity type according to another exemplary embodiment.

The grade 616 is disposed within the drain region 206 of the substrate 200 and located around the doped region 206a. In addition, the grade 616 is, for example, an N-type grade. The drift 618 is disposed below parts of the isolation structure 612 and electrically connected to the gate structure 604 and the grade 616. Besides, the drift 618 is, for example, an N-type drift.

As indicated in FIG. 7, the semiconductor devices can be high voltage devices 701 and 702 which are double diffused drain metal-oxide semiconductor (DDDMOS) devices, for example. The high voltage devices 701 and 702 are, for example, similar to the semiconductor devices 201 and 202 depicted in FIG. 4, while the difference therebetween mainly lies in the gate structures 704 in the high voltage devices 701 and 702. Besides, the high voltage devices 701 and 702 further include grades 712 of the second conductivity type.

The gate structure 704 in each of the high voltage devices 701 and 702 is disposed on the substrate 200 between the drain region 206 and the source region 208. The gate structure 704 includes a gate 704a, a gate dielectric layer 704b, and a spacer 704c. The gate dielectric layer 704b is disposed between the gate 704a and the substrate 200, and the spacer 704c is disposed on a sidewall of the gate 704a and a sidewall of the gate dielectric layer 704b.

The grade 712 in each of the high voltage devices 701 and 702 is disposed within the drain region 206 of the substrate 200, and the doped region 206a is, for example, disposed in the grade 712. According to an exemplary embodiment, the grade 712 can further extend from the drain region 206 to a portion of the substrate 200 located below parts of the gate structure 704. Besides, the grade 712 is, for example, a high voltage N-type grade (HVNG).

Figure 8:
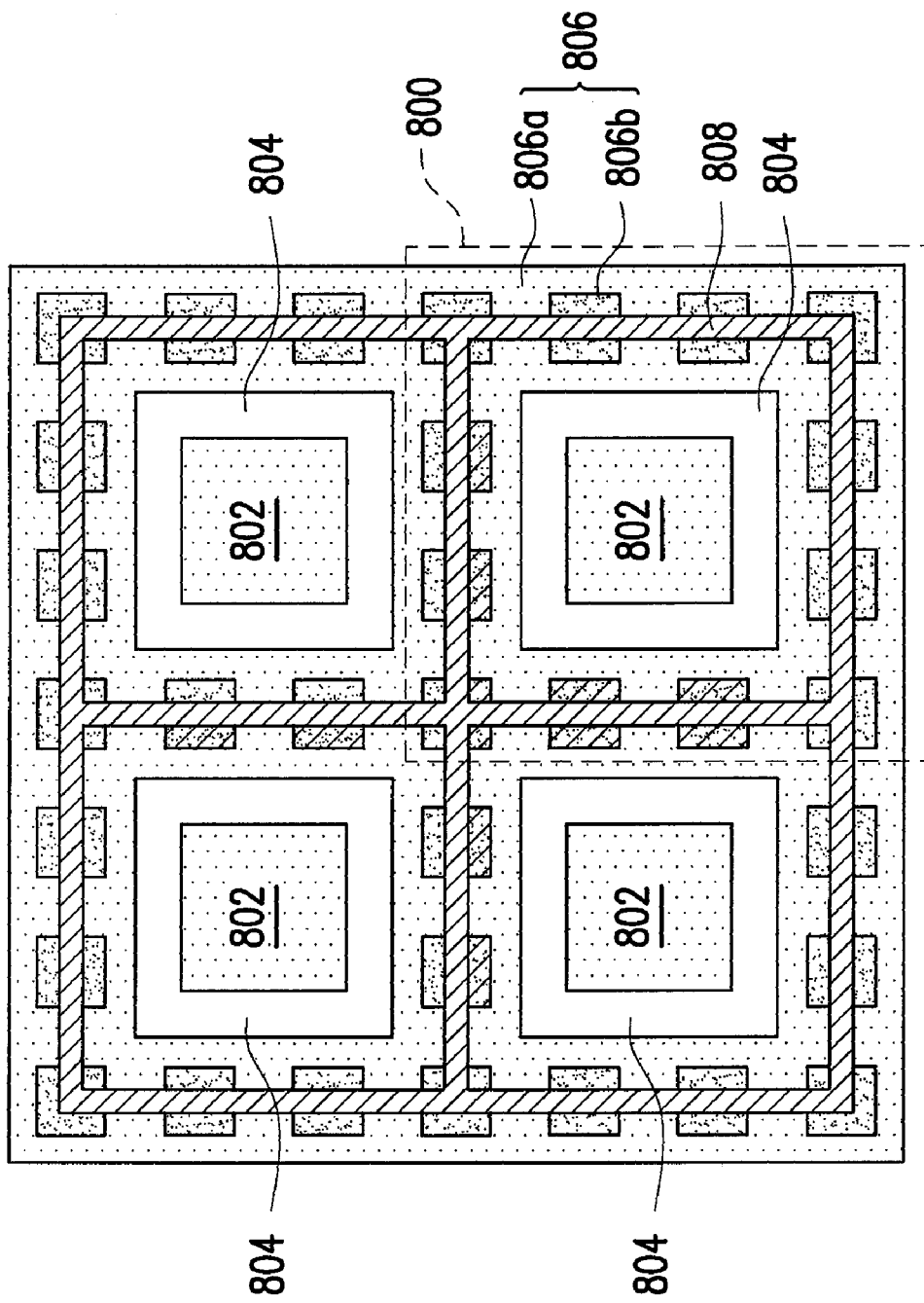
FIG. 8 is a schematic top view illustrating a layout of a semiconductor device according to another exemplary embodiment of the present invention.

FIG. 8 is a schematic top view illustrating a layout of a semiconductor device according to another exemplary embodiment of the present invention.

As shown in FIG. 8, the semiconductor device can serve as a high voltage device 800 which is a power device (high power device), for example. In terms of layout, four regular quadrilateral devices together form a basic unit as shown in FIG. 8, for example, while the number and the shape of the devices are not limited in the present invention. In the present embodiment, four individual drain regions 802 are respectively disposed in four high voltage devices 800 and arranged in 2×2 array. Each of the four gate structures 804 surrounds one of the drain regions 802, for example. Besides, the four gate structures 804 are individually disposed. Namely, each of the individual drain regions 802 is respectively disposed within an area enclosed by one of the gate structures 804, and each of the drain regions 802 and each of the gate structures 804 together form one unit for use. The source region 806 surrounds the four gate structures 804, for instance.

In one single high voltage device 800, the gate structure 804 and the source region 806 surround the periphery of the drain region 802, for example. That is to say, the gate structure 804 substantially surrounds the drain region 802, and the source region 806 is substantially located around the gate structure 804. Moreover, as indicated in FIG. 8, the source region 806 is located between two gate structures 804 of two adjacent high voltage devices 800. In other words, the two adjacent high voltage devices 800 share the source region 806.

According to an exemplary embodiment, in one single high voltage device 800, the drain region 802 includes doped regions of the second conductivity type, and the doped regions are disposed in the substrate of the first conductivity type. The source region 806 includes the doped region 806a of the second type and the doped regions 806b of the first conductivity type. The doped regions 806a and 806b are disposed in the substrate. In the source region 806, the doped region 806a surrounds each of the doped regions 806b. According to an exemplary embodiment, the doped regions 806b parallel to each side of the gate structure 804 surround the gate structure 804. The gate structure 804 located between the drain region 802 and the source region 806 is disposed on the substrate.

In one single high voltage device 800, the contact 808 is disposed within the source region 806. The contact 808 connects, in the direction parallel to the gate structure 804, at least three joined doped regions 806a and 806b having the alternate conductivity types so as to connect external circuits. In other words, the doped regions 806a and 806b are connected through sharing the conductive contact 808. As shown in FIG. 8, in one single high voltage device 800, the contact 808 parallel to each side of the gate structures 804 consecutively surrounds the periphery of gate structure 804, for example. Further, the contact 808 connects all of the doped regions 806a and 806b around the gate structure 804. In addition, at least one contact is disposed on each of the drain regions 802 for connecting external circuits.

According to another exemplary embodiment, a plurality of the contacts arranged parallel to each side of the gate structures 804 can inconsecutively surround the periphery of the gate structures 804 and individually connect at least three joined doped regions 806a and 806b having the alternate conductivity types. The number of the contacts and the number of the doped regions connected by each of the contacts are not limited in the present invention.

Figure 9:
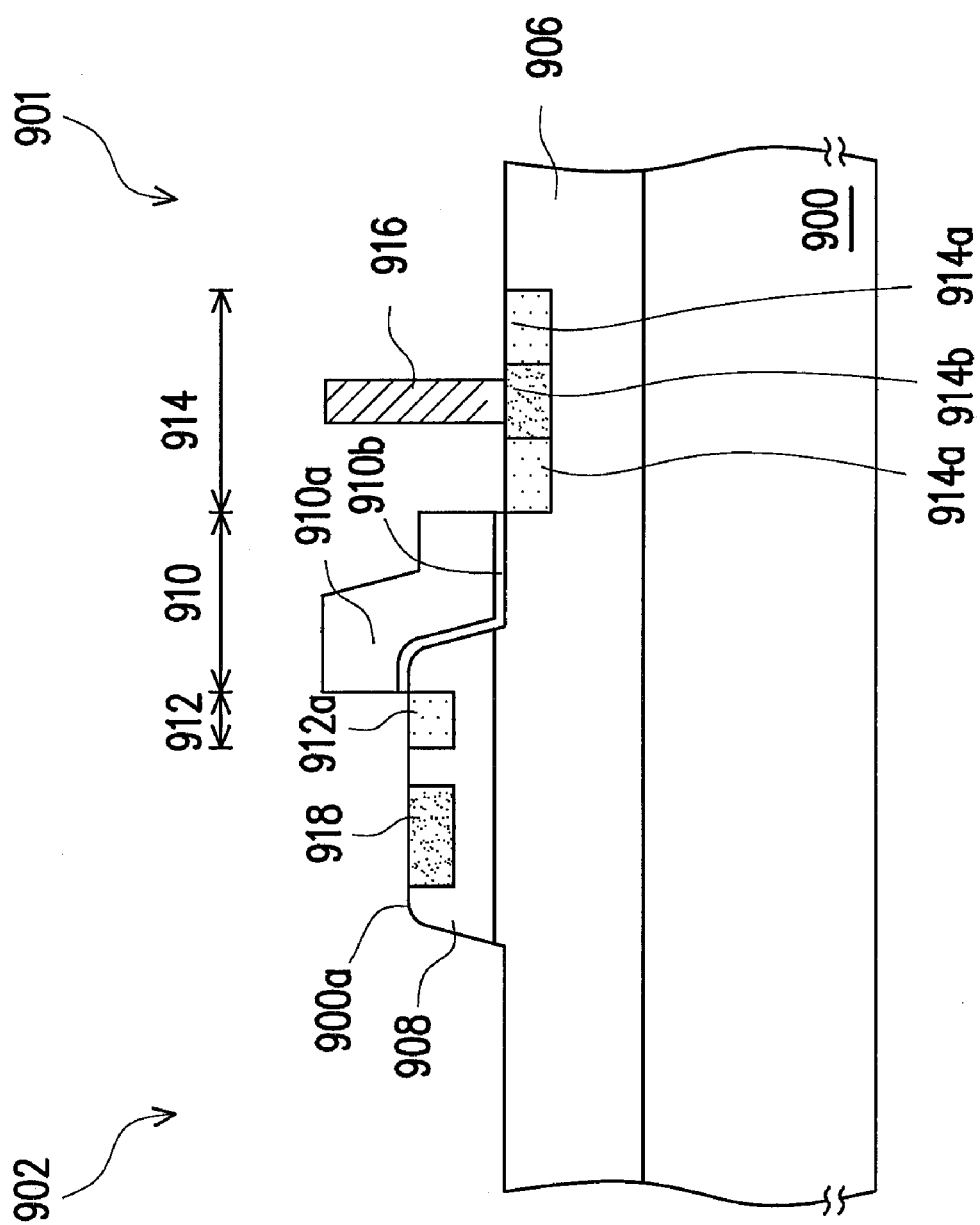
FIG. 9 is a schematic cross-sectional view of a semiconductor device according to another exemplary embodiment of the present invention.

According to an exemplary embodiment, the semiconductor device further includes a bipolar junction transistor (BJT). In other words, the aforesaid MOS structure and the BJT are integrated on the same chip in the semiconductor device, for instance. FIG. 9 is a schematic cross-sectional view of a semiconductor device according to another exemplary embodiment of the present invention. In the following embodiment, note that the first conductivity type is the N type, and the second conductivity type is the P type, which should however not be construed as limitations to the present invention. People skilled in the art should be aware that the first conductivity type can also be the P type, and the second conductivity type can also be the N type according to other embodiments of the present invention.

As indicated in FIG. 9, in an exemplary embodiment, the semiconductor device includes a substrate 900 of the first conductivity type, an MOS device 901, and a BJT 902. The substrate 900 has a protruding mesa portion 900a. The substrate 900 is, for example, an N+ type substrate. In an exemplary embodiment, a doped region 906 of the first conductivity type and a doped region 908 of the second conductivity type are disposed in the substrate 900. The doped region 906 is, for example, an N− doped region serving as a main body of the MOS device 901 and disposed in the substrate 900. The doped region 908 is, for example, a P− doped region disposed in the doped region 906, and the doped region 908 is substantially located within the protruding mesa portion 900a.

The MOS device 901 includes a gate structure 910, a drain region 912, a source region 914, and a contact 916. In an embodiment, the MOS device 901 can be a sidewall MOS device. The gate structure 910 is located on the substrate 900 between the drain region 912 and the source region 914 and partially covers the protruding mesa portion 900a and a sidewall of the mesa portion 900a, for example. The gate structure 910 includes a gate 910a and a gate dielectric layer 910b. The gate dielectric layer 910b is disposed between the substrate 900 and the gate 910a. The drain region 912 includes a doped region 912a which is disposed in the substrate 900 and located at a side of the gate structure 910. The doped region 912a of the second conductivity type is, for example, a P+ doped region and serves as a drain terminal of the MOS device 901. The source region 914 includes a doped region 914a and at least one doped region 914b which are disposed in the substrate 900 and located at the other side of the gate structure 910. For illustration purposes, the following disclosure is described in terms of a plurality of the doped regions 914b, which are illustrated only as an exemplary example, and should not be adopted for limiting the scope of the present invention. The doped region 914a surrounds each of the doped regions 914b. Besides, the doped regions 914b are arranged parallel to the gate structure 910. The doped region 914a of the second conductivity type is, for example, P+ doped region and serves as source terminal of the MOS device 901. The doped regions 914b of the first conductivity type are, for example, N+ doped regions and serve as the substrate terminal of the substrate 900. The contact 916 is disposed within the source region 914. The contact 916 connects, in the direction parallel to the gate structure 910, at least three joined doped regions 914a and 914b alternately so as to connect external circuits.

A doped region 918 of the first conductivity type is further disposed in the protruding mesa portion 900a. The doped region 918 is, for example, an N+ doped region disposed in the doped region 908. As such, the doped regions 918, 908, 912a, 906, and 914b together form a vertical npn BJT 902. Particularly, the doped region 918 serves as an emitter of the BJT 902, the doped regions 908 and 912a together serve as a base of the BJT 902, and the doped regions 906 and 914b together act as a collector of the BJT 902, for example.

In an exemplary embodiment, when the MOS device 901 and the BJT 902 are integrated onto the same chip, the MOS device 901 and the BJT 902 share the gate structure 910 and the doped regions 912a and 914b, for instance. In addition, the contact 916 connects at least three joined doped regions 914a and 914b alternately, and thereby the source terminal (the doped region 914a) of the MOS device 901 and the collector (the doped regions 914b) of the BJT 902 can be electrically connected together.

According to the present embodiment, note that the layout of the source region 914 can be the same as the layout of the source region 208 depicted in FIG. 2A or FIG. 3. The doped regions 914b arranged along a direction parallel to the gate structure 910 are distributed separately in the source region 914. Besides, the doped region 914a which has the conductivity type different from that of the doped regions 914b surrounds the doped regions 914b. As a result, the contact 916 simultaneously connects the doped regions 914a and 914b along a direction parallel to the gate structure 910. Therefore, through the contact 916 which acts as a butting contact and connects the doped regions 914a and 914b, the layout area of the source region 914 can be reduced, and so can the chip area be reduced.

It should be mentioned that said embodiments can be collectively carried out. The aforesaid embodiments are not bound to be fulfilled individually. Additionally, the present invention can be applied in designing source regions in all kinds of MOS transistors, and thereby device dimension can be decreased.

Certainly, in other embodiments, the adjacent semiconductor devices can be designed to have a common drain. In other words, when the adjacent semiconductor devices share the drain region, the layout design employed in the source region of said embodiments can also be applied to the common drain region, such that each doped region acting as the substrate terminal is surrounded by a doped region acting as the drain terminal.

Figure 11A:
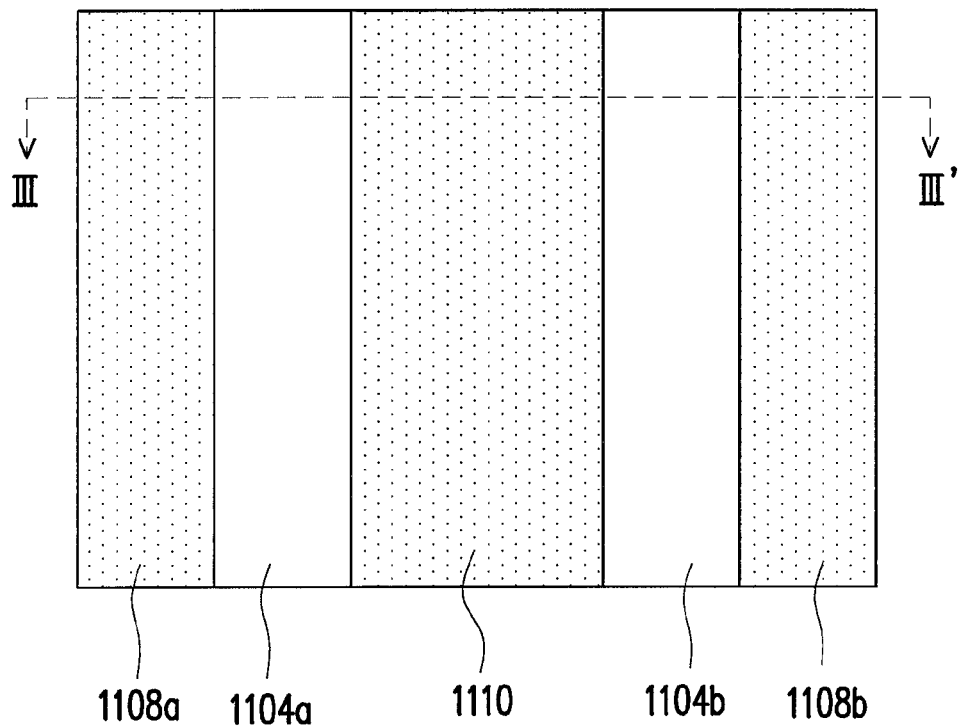
FIGS. 11A and 12A are schematic top views of fabricating procedures of a semiconductor device according to an exemplary embodiment of the present invention.
Figure 11B:
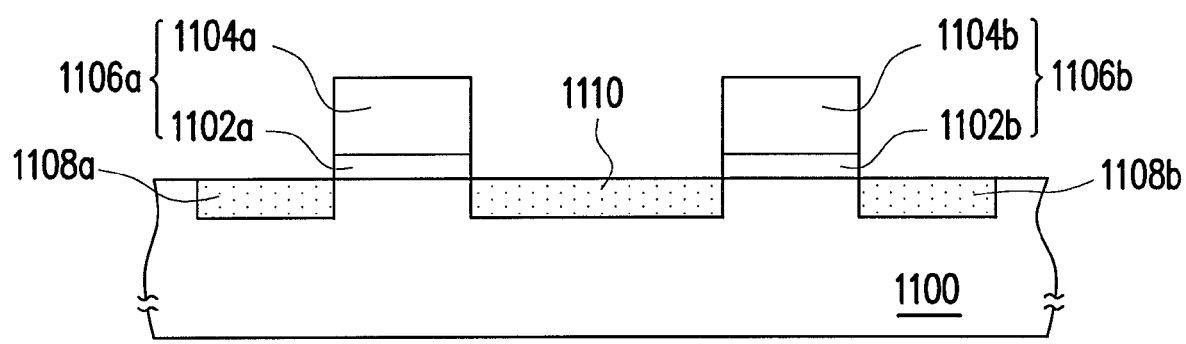
FIGS. 11B and 12B are schematic cross-sectional views taken along a line segment III-III' depicted in respective FIGS. 11A and 12A.
Figure 12A:
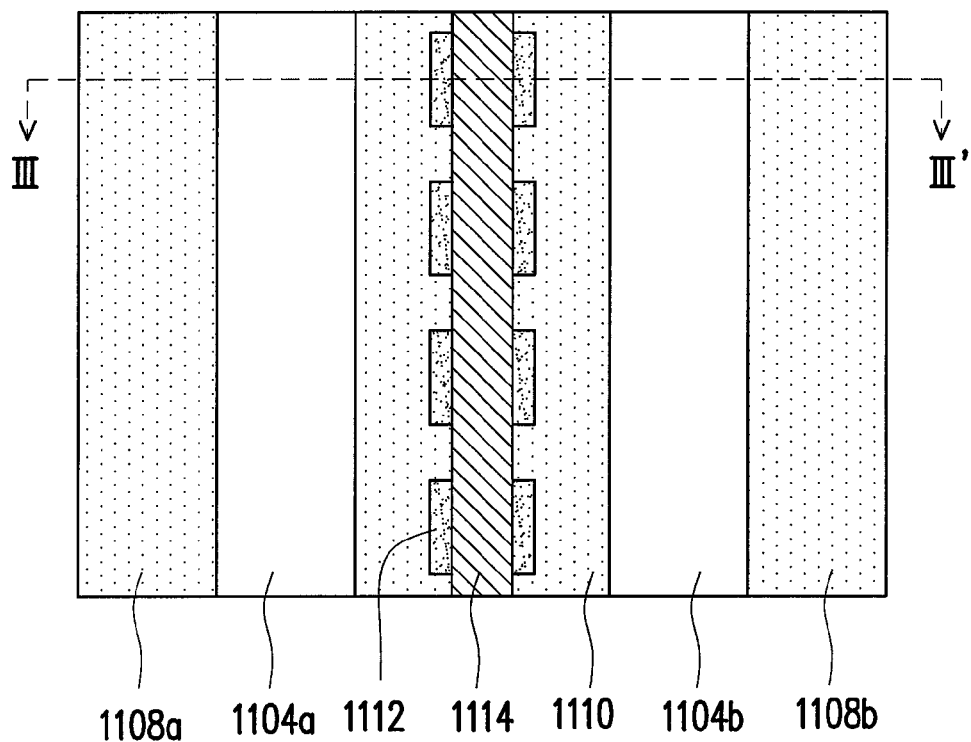
Figure 12B:
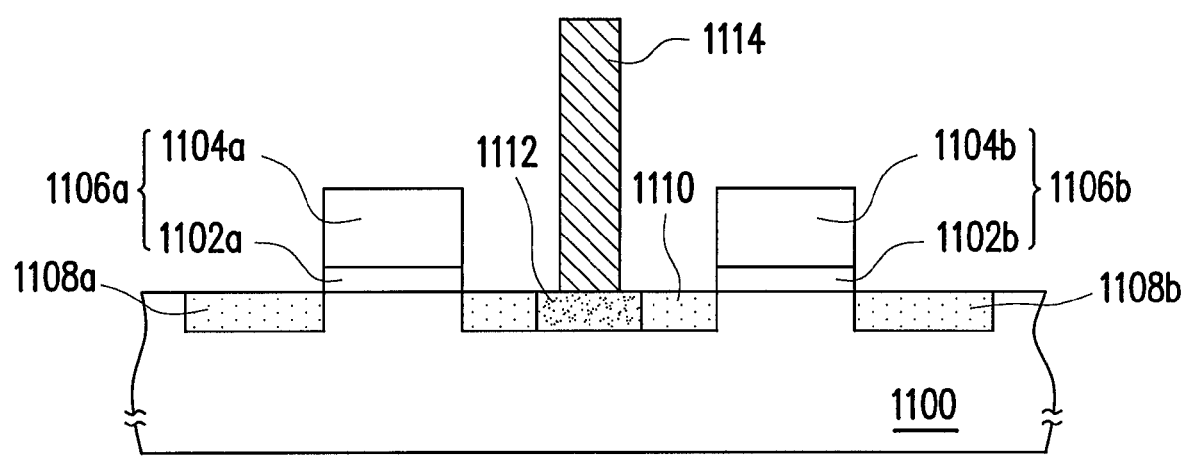

FIGS. 11A and 12A are schematic top views of fabricating procedures of a semiconductor device according to an exemplary embodiment of the present invention. FIGS. 11B and 12B are schematic cross-sectional views taken along a line segment III-III' depicted in respective FIGS. 11A and 12A.

As indicated in FIGS. 11A and 11B, a substrate 1100 of the first conductive conductivity type is provided. The substrate 1100 is, for example, a P-type silicon substrate or an N-type silicon substrate. In an exemplary embodiment of the present invention, a well of the first conductivity type (not shown) can be formed in the substrate 1100. A dielectric layer and a conductive layer are formed in sequence on the surface of the substrate 1100. A method for forming the dielectric layer can be a thermal oxidation process so as to form a silicon oxide layer. The conductive layer is made of doped polysilicon, and the forming method thereof is chemical vapor deposition (CVD), for example. The dielectric layer and the conductive layer are then patterned to form gate dielectric layers 1102a and 1102b and gates 1104a and 1104b. The stacked gate dielectric layer 1102a and the gate 1104a can be a gate structure 1106a. The stacked gate dielectric layer 1102b and the gate 1104b can be a gate structure 1106b. Doped regions 1108a, 1108b and 1110 of the second conductivity type are formed in the substrate 1100 at both side of the gate structure 1106a and 1106b, respectively. The doped regions 1108a and 1108b may serve as a drain of two respective semiconductor devices. The doped region 1110 may serve as a common source of the two adjacent semiconductor devices.

As indicated in FIGS. 12A and 12B, at least one doped region 1112 of the first conductivity type is formed in the substrate 1100 between the gate structures 1106a and 1106b. When a plurality of the doped regions 1112, the doped regions 1112 are arranged in a direction parallel to the gate structures 1106a and 1106b. The doped regions 1112 serve as terminals of the substrate 1100 connected to external devices, for instance. Afterwards, a contact 1114 is formed on the surface of the substrate 1100. The contact 1114 may be located upon the doped regions 1110 and 1112. The contact 1114 connects, in the direction parallel to the gate structures 1106a and 1106b, at least three joined doped regions 1110 and 1112, so as to act as a butting contact.

It should be noticed that the foregoing embodiment in which two semiconductor devices are formed and share the common source is provided for illustration purposes, and should not be construed as limiting the scope of the present invention. People skilled in the art should be able to make modifications in accordance with said embodiments, and thus, the detailed descriptions thereof are not described herein.

An experimental example is provided below to verify that the layout of the semiconductor device in the present application does not jeopardize the device performance. Note that the following experimental example simply serves to explain that the layout of the semiconductor device in the present application poses an influence on a drain voltage and a drain current, which should not be construed as a limitation to the present invention.

EXPERIMENTAL EXAMPLE

Figure 10:
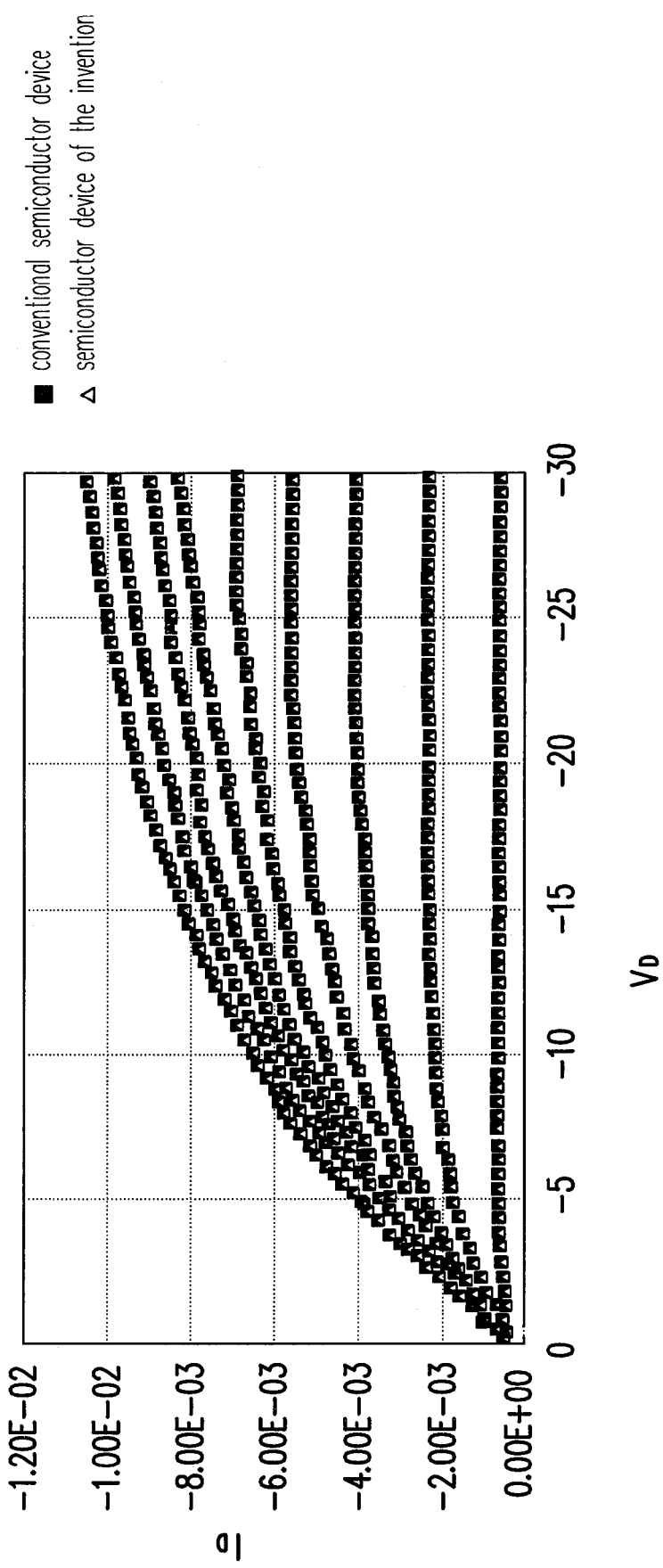
FIG. 10 is a curve diagram illustrating a correlation between a drain voltage ($V_D$) and a drain current ($I_D$) according to an experimental example of the present invention.

FIG. 10 is a curve diagram illustrating a correlation between a drain voltage ($V_D$) and a drain current ($I_D$) according to an experimental example of the present invention.

In the experimental example, various gate voltages ($V_g$) are applied respectively to a gate of the semiconductor device of the present application and a gate of a conventional semiconductor device so as to measure the drain voltage ($V_D$) and the drain current ($I_D$). The results of the experiment are shown in FIG. 10. As indicated in FIG. 10, when the same gate voltage ($V_g$) is applied, the semiconductor device of the present application and the conventional semiconductor device have the same I-V curve. Besides, although the gate voltage ($V_g$) is changed, the semiconductor device of the present application and the conventional semiconductor device still have the same I-V curve. It can be learned from the above experimental example that although the dimension of the semiconductor device in the present application is reduced by means of specific layout design, this layout design does not affect the electric properties of the device. Instead, this layout design is conducive to stabilizing the performance of the semiconductor device in the present application.

Based on the foregoing, through changing the arrangement of the doped regions in the source region of the semiconductor device described in one exemplary embodiment of the present invention, the contact extending along a direction parallel to the gate structure can be used to connect at least three joined doped regions having the alternate conductivity types. Thereby, the layout area of the source region can be reduced.

Moreover, the fabrication method of the semiconductor device as disclosed in one exemplary embodiment of the present invention can be applied to all MOS structures, and the fabrication of the semiconductor device can be integrated with existing manufacturing processes by modifying patterns of photomasks, such that simple fabrication can be guaranteed, and unnecessary waste on chip area can be prevented.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor device comprising:
   a substrate of a first conductivity type;
   a first doped region of a second conductivity type, wherein the first doped region is disposed in the substrate;
   a plurality of second doped regions of the first conductivity type, wherein the plurality of second doped regions are disposed in the substrate and separated from each other, and each of the plurality of second doped is regions are surrounded by the first doped region;
   a third doped region of the second conductivity type, wherein the third doped region is disposed in the substrate outside of the first doped region;
   a gate structure disposed on the substrate between the first doped region and the third region, wherein the plurality of second doped regions are arranged in a direction parallel to the gate structure; and
   at least one contact disposed on the substrate, wherein each of the at least one contact connects, in a direction parallel to the gate structure, the first and second doped regions alternately.

2. The semiconductor device as claimed in claim 1, wherein each of the at least one contact connects at least three joined first and second doped regions alternately.

3. The semiconductor device as claimed in claim 1, wherein the semiconductor device includes a plurality of the contacts, and the contacts are arranged in the direction parallel to the gate structure.

4. The semiconductor device as claimed in claim 1, wherein the first region serves as a common source of the semiconductor device and another semiconductor device adjacent thereto.

5. The semiconductor device as claimed in claim 1, wherein the semiconductor device is a metal-oxide semiconductor device.

6. The semiconductor device as claimed in claim 1, further comprising a bipolar junction transistor, wherein the bipolar junction transistor and the semiconductor device share the contact.

7. The semiconductor device as claimed in claim 6, wherein the bipolar junction transistor and the semiconductor device share the second doped region and the third doped region.

8. The semiconductor device as claimed in claim 6, wherein the semiconductor device is a sidewall metal-oxide semiconductor device.

9. The semiconductor device as claimed in claim 1, wherein the first conductivity type is of a P type while the second conductivity type is of an N type, or the first conductivity type is of an N type while the second conductivity type is of a P type.

10. A semiconductor device comprising:
a substrate of a first conductivity type;
a first doped region of a second conductivity type, wherein the first doped region is disposed in the substrate; and
a plurality of second doped regions of the first conductive conductivity type, wherein the plurality of second doped regions are disposed in the substrate and separated from each other;
a third doped region of the second conductivity type, wherein the third doped region is disposed in the substrate outside of the first doped region;
a gate structure disposed on the substrate between the first doped region and the third doped region, wherein the plurality of second doped regions are arranged in a direction parallel to the gate structure; and
at least one contact disposed on the substrate, wherein each of the at least one contact connects, in a direction parallel to the gate structure, at least three joined first and second doped regions alternately.

11. The semiconductor device as claimed in claim 10, wherein the semiconductor device includes a plurality of the contacts, and the contacts are arranged in the direction parallel to the gate structure.

12. The semiconductor device as claimed in claim 10, wherein the first region serves as a common source of the semiconductor device and another semiconductor device adjacent thereto.

13. The semiconductor device as claimed in claim 10, wherein the semiconductor device is a metal-oxide semiconductor device.

14. The semiconductor device as claimed in claim 10, further comprising a bipolar junction transistor, wherein the bipolar junction transistor and the semiconductor device share the contact.

15. The semiconductor device as claimed in claim 14, wherein the bipolar junction transistor and the semiconductor device share the second doped region and the third doped region.

16. The semiconductor device as claimed in claim 14, wherein the semiconductor device is a sidewall metal-oxide semiconductor device.

17. The semiconductor device as claimed in claim 10, wherein the first conductivity type is of a P type while the second conductivity type is of an N type, or the first conductivity type is of an N type while the second conductivity type is of a P type.

18. A method for fabricating a semiconductor device comprising:
providing a substrate of a first conductivity type;
forming a gate structure on the substrate;
forming a first doped region of a second conductivity type and a plurality of second doped regions of the second conductivity type in the substrate at both sides of the gate structure, respectively, wherein the plurality of second doped regions are arranged in a direction parallel to the gate structure and separated from each other;
forming at least one third doped region of the first conductivity type in the substrate; and
forming at least one contact on the substrate, wherein each of the at least one contact connects, in a direction parallel to the gate structure, at least three joined first and third doped regions alternately.

19. The method as claimed in claim 18, wherein each of the at least one third doped region is surrounded by the first doped region.

20. The method as claimed in claim 18, wherein the first conductivity type is of a P type while the second conductivity type is of an N type, or the first conductivity type is of an N type while the second conductivity type is of a P type.

* * * * *